(12) United States Patent
Gong et al.

(10) Patent No.: US 10,553,624 B2
(45) Date of Patent: Feb. 4, 2020

(54) MANUFACTURING METHOD OF ARRAY SUBSTRATE, ARRAY SUBSTRATE AND DISPLAY APPARATUS

(71) Applicants: BOE Technology Group Co., Ltd., Beijing (CN); Hefei BOE Optoelectronics Technology Co., Ltd., Hefei (CN)

(72) Inventors: Kui Gong, Beijing (CN); Xianxue Duan, Beijing (CN)

(73) Assignees: BOE Technology Group Co., Ltd., Beijing (CN); Hefei BOE Optoelectronics Technology Co., Ltd., Hefei (CN)

( * ) Notice: Subject to any disclaimer, the term of this patent is extended or adjusted under 35 U.S.C. 154(b) by 37 days.

(21) Appl. No.: 15/762,292

(22) PCT Filed: Sep. 8, 2017

(86) PCT No.: PCT/CN2017/101051
§ 371 (c)(1),
(2) Date: Mar. 22, 2018

(87) PCT Pub. No.: WO2018/149119
PCT Pub. Date: Aug. 23, 2018

(65) Prior Publication Data
US 2019/0074305 A1  Mar. 7, 2019

(30) Foreign Application Priority Data

Feb. 20, 2017 (CN) .......................... 2017 1 0090921

(51) Int. Cl.
*H01L 27/12* (2006.01)
*H01L 21/027* (2006.01)
(Continued)

(52) U.S. Cl.
CPC ...... *H01L 27/1288* (2013.01); *H01L 21/0274* (2013.01); *H01L 21/3212* (2013.01);
(Continued)

(58) Field of Classification Search
CPC . H01L 27/124; H01L 27/1222; H01L 27/127; H01L 27/1288
See application file for complete search history.

(56) References Cited

U.S. PATENT DOCUMENTS

2009/0146930 A1*  6/2009  Nishimura .......... H01L 27/3262
                                                      345/80
2014/0007160 A1   1/2014  Debois et al.
(Continued)

FOREIGN PATENT DOCUMENTS

CN      101833204 A     9/2010
CN      103295962 A     9/2013
(Continued)

OTHER PUBLICATIONS

Machine Translation of CN106098701.*
(Continued)

*Primary Examiner* — Selim U Ahmed
*Assistant Examiner* — Evan G Clinton
(74) *Attorney, Agent, or Firm* — Banner & Witcoff, Ltd.

(57) ABSTRACT

A manufacturing method of an array substrate, an array substrate and a display apparatus are provided. The manufacturing method includes: providing a base substrate; sequentially forming an active layer and a first insulating layer that covers the active layer on the base substrate; performing one patterning process on the first insulating layer, so as to form a first through hole and a second through hole that expose the active layer in the first insulating layer, and form a first recess at a surface of the first insulating layer; forming a conductive layer on the patterned first
(Continued)

insulating layer, with the conductive layer being filled in the first through hole, the second through hole and the first recess; conducting a grinding process to form a source electrode, a drain electrode and a pixel electrode are formed respectively.

15 Claims, 10 Drawing Sheets

(51) Int. Cl.
    *H01L 21/321*     (2006.01)
    *H01L 21/768*     (2006.01)
    *H01L 29/16*     (2006.01)
    *H01L 29/66*     (2006.01)
    *H01L 29/786*     (2006.01)
    *G02F 1/1362*     (2006.01)
    *G02F 1/1368*     (2006.01)

(52) U.S. Cl.
    CPC .... *H01L 21/7684* (2013.01); *H01L 21/76802* (2013.01); *H01L 21/76877* (2013.01); *H01L 27/124* (2013.01); *H01L 27/127* (2013.01); *H01L 27/1222* (2013.01); *H01L 29/1606* (2013.01); *H01L 29/66045* (2013.01); *H01L 29/78684* (2013.01); *G02F 1/1368* (2013.01); *G02F 1/136286* (2013.01); *G02F 2001/13685* (2013.01); *G02F 2001/136295* (2013.01)

(56) References Cited

U.S. PATENT DOCUMENTS

2015/0179679 A1    6/2015    Im
2016/0293628 A1    10/2016    Ning
2017/0062239 A1*    3/2017    Yoo .......................... H01L 21/77
2017/0117307 A1*    4/2017    Shih .......................... G03F 1/00

FOREIGN PATENT DOCUMENTS

| CN | 103474475 A | 12/2013 |
|---|---|---|
| CN | 104217994 A | 12/2014 |
| CN | 106098701 A | 11/2016 |
| CN | 106158883 A | 11/2016 |
| CN | 106229296 A | 12/2016 |
| CN | 106847744 A | 6/2017 |

OTHER PUBLICATIONS

Machine Translation of CN103474475.*
Dec. 8, 2017—(WO) International Search Report and Written Opinion Appn PCT/CN2017/101051 with English Tran.
Feb. 28, 2019—(CN) First Office Action Appn 201710090921.5 with English Translation.

* cited by examiner

MANUFACTURING METHOD OF ARRAY SUBSTRATE, ARRAY SUBSTRATE AND DISPLAY APPARATUS

The application is a U.S. National Phase Entry of International Application No. PCT/CN2017/101051 filed on Sep. 8, 2017, designating the United States of America and claiming priority to Chinese Patent Application No. 201710090921.5, filed on Feb. 20, 2017. The present application claims priority to and the benefit of the above-identified applications and the above-identified applications are incorporated by reference herein in their entirety.

TECHNICAL FIELD

Embodiments of the present disclosure relate to a manufacturing method of an array substrate, an array substrate and a display apparatus having the array substrate.

BACKGROUND

Along with the development of display technology, Liquid Crystal Displays (LCDs) and other planar display apparatuses are widely applied to various display apparatuses such as mobile phones, televisions, personal digital assistants, digital cameras, notebook computers, desktop computers and the like because they have advantages of high picture quality, electricity saving property, thin profile, wide application scope and so on, and have become the mainstream among display apparatuses.

Liquid crystal displays can be classified into a vertical electric field type and a horizontal electric field type according to the direction of an electric field for driving liquid crystals. The vertical electric field type includes a Twist Nematic (TN) mode, which requires to form a pixel electrode on an array substrate and to form a common electrode on a color filter substrate; the horizontal electric field type includes an In-Plane Switching (IPS) mode, a Fringe Field Switching (FFS) mode, an Advanced Super Dimension Switch (ADS) mode and so on, which require to form both a pixel electrode and a common electrode on an array substrate. At present, as for a liquid crystal display of a vertical electric field type or a liquid crystal display of a horizontal electric field type, the array substrate thereof usually needs four or five masking processes in manufacturing, and this leads to the situation that the manufacturing process of the array substrate is complex, the production efficiency is low and the production cost is high. Moreover, as the sizes of liquid crystal displays become larger and larger, the plural manufacturing processes also lead to a degraded yield of liquid crystal displays and a lowered production capacity.

SUMMARY

At least one embodiment of the present disclosure provides a manufacturing method of an array substrate, comprising: providing a base substrate; sequentially forming an active layer and a first insulating layer that covers the active layer on the base substrate; performing one patterning process on the first insulating layer, so as to form a first through hole and a second through hole that expose the active layer in the first insulating layer, and form a first recess at a surface of the first insulating layer; forming a conductive layer on the patterned first insulating layer, with the conductive layer being filled in the first through hole, the second through hole and the first recess; and conducting a grinding process to remove the conductive layer on the surface of the first insulating layer and retain the conductive layer in the first through hole, the second through hole and the first recess, whereby a source electrode, a drain electrode and a pixel electrode are formed respectively.

At least one embodiment of the present disclosure provides an array substrate, comprising: a base substrate; an active on the base substrate and a first insulating layer covering the active layer, the first insulating layer having a first through hole and a second through hole that expose the active layer and a first recess at a surface of the first insulating layer; a source electrode and a drain electrode that are located in the first through hole and the second through hole in the first insulating layer, respectively, and connected to the active layer, and a pixel electrode in the first recess.

At least one embodiment of the present disclosure provides a display apparatus, comprising the array substrate claimed as the above embodiment.

A manufacturing method of an array substrate, an array substrate and a display apparatus are provided by at least one embodiment of the present disclosure. In the manufacturing method of the array substrate of these embodiments, the array substrate can be manufactured by using two or three masking process, and the number of masking process required for manufacturing of the array substrate is decreased, the manufacturing flow of the process is simplified, the complexity degree of process and the manufacturing cost are lowered, fabricating time is shortened, production efficiency is enhanced, and yield of product is promoted.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 1b is a schematic view showing sectional structure of the array substrate taken along the direction of line A-A' in FIG. 1a;

FIG. 1c is a schematic view showing sectional structure of the array substrate taken along the direction of line B-B' in FIG. 1a;

FIG. 6b is a schematic view showing the sectional structure of an example of the array substrate taken along the direction of line C-C' in FIG. 6a;

FIG. 6c is a schematic view showing the sectional structure of another example of the array substrate taken along the direction of line C-C' in FIG. 6a;

FIG. 7b is a schematic view showing the sectional structure of the array substrate taken along the direction of line D-D' in FIG. 7a;

FIG. 7c is a schematic view showing the sectional structure of the array substrate taken along the direction of line E-E' in FIG. 7a.

DETAILED DESCRIPTION

Figure 1A:
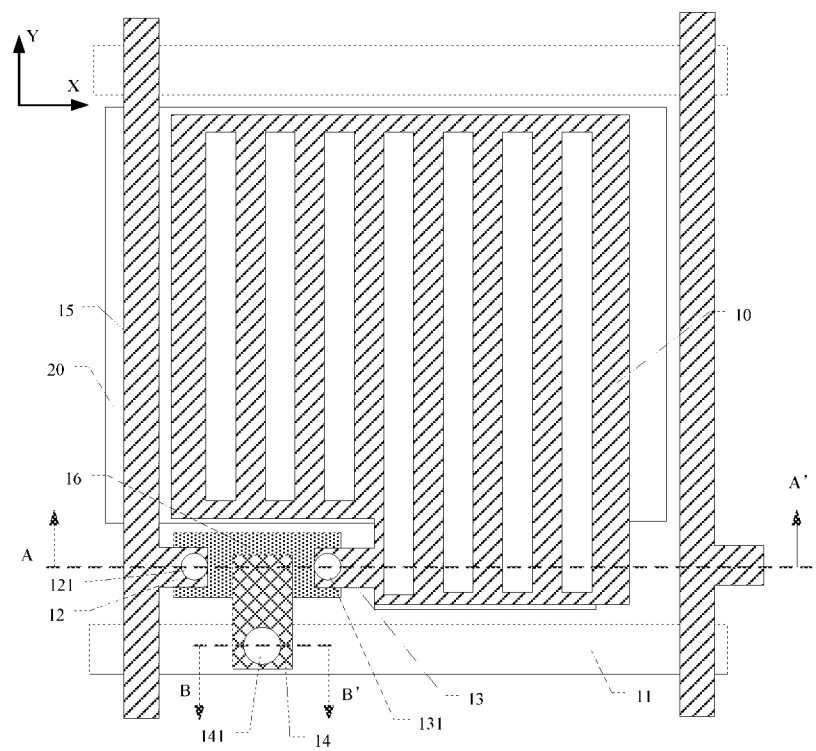
FIG. 1a is a schematically plan view showing an array substrate provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects.

Each component or structure in accompanied drawings is not drawn strictly according to proportions, and for the sake of clarity, size of each component or structure might be exaggerated or understated. For example, thickness of a layer, width of an electrode or the like is increased. However, these shall not be used to limit scope of the present disclosure. In order to keep the following descriptions of embodiments of the present disclosure clear and concise, detailed description of known functions and known components may be omitted.

The flow of fabricating process of a thin film transistor array substrate may usually include sequentially forming an active layer, an insulating layer, a metal gate layer, a passivation layer, a source-drain electrode layer, a pixel electrode layer and the like on a base substrate, and four or five masking processes are generally needed. Each of the masking processes includes conducting exposure with a mask, and then performing development, etching and other procedures. Thus, the manufacturing process of the array substrate is complex, and the production efficiency is low. Besides, the cost of a mask is relatively high, thereby leading to a relatively high manufacturing cost of products, and the plural mask processes cause the manufacturing time of products to increase, the yield of products to lower, and the production capacity to lower. Consequently, development of thin-film-transistor array substrate technology is restricted.

According to at least an embodiment of the present disclosure, there are provided a manufacturing method of an array substrate, an array substrate and a display device. The manufacturing method of the array substrate includes providing a base substrate, sequentially forming an active layer and a first insulating layer covering the active layer on the base substrate; conducting one patterning process on the first insulating layer, so as to form a first through hole and a second through hole that expose the active layer in the first insulating layer, and form a first recess at a surface of the first insulating layer; forming a conductive layer on the patterned first insulating layer, the conductive layer being filled in the first through hole, the second through hole and the first recess; conducting a grinding process to remove the conductive layer on the surface of the first insulating layer, and to retain the conductive layer in the first through hole, the second through hole and the first recess, whereby a source electrode, a drain electrode and a pixel electrode are formed respectively.

In the manufacturing method of the array substrate, an active layer is formed by one masking process, and then, by one more masking process, and subsequently by one grinding procedure, a source electrode, a drain electrode and a pixel electrode are formed. In this way, the number of required masking processes is decreased, the flow of manufacturing process is simplified, the complexity degree of process and production costs are reduced, fabricating time is shortened, production efficiency is enhanced, and yield of product is promoted. Furthermore, in some embodiments, a transparent, graphene-like semiconductor is used for the active layer, a graphene conductor is used for a gate line, and the source electrode, the drain electrode, the gate electrode and the pixel electrode are formed of transparent indium tin oxide. Thus, with this method, the number of masking processes can be further decreased, and moreover, aperture ratio, stability and transparency of an array substrate can be improved as well. Curvature of the active layer can meet the demands of a flexible display device.

Hereinafter, several embodiments of the present disclosure will be described in detail, but the present disclosure is not limited to these specific embodiments.

Embodiment 1

Figure 1B:
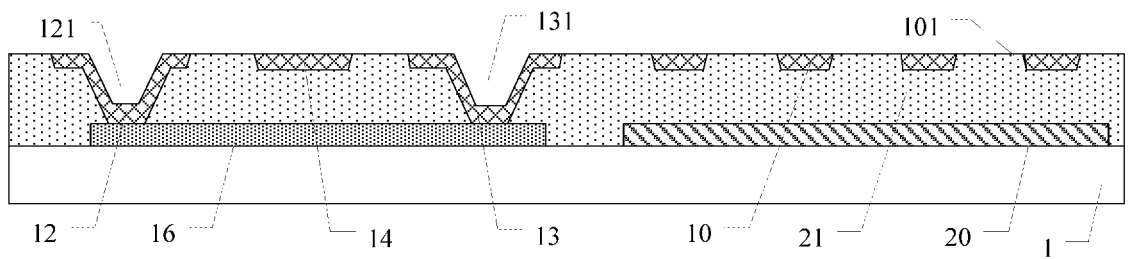
Figure 1C:
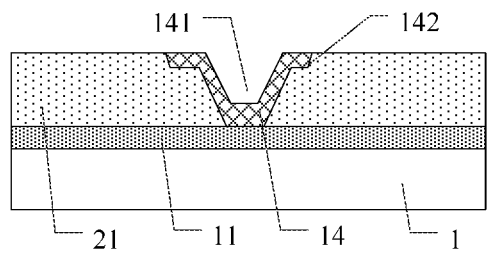
Figure 2A:
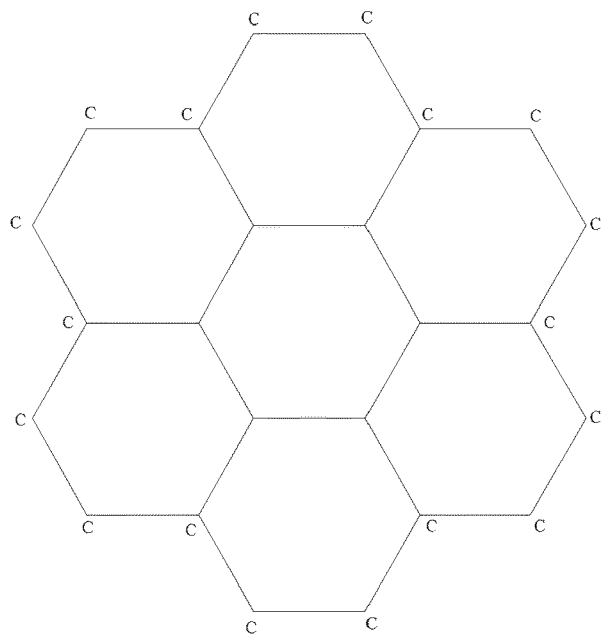
FIG. 2a is a schematic view showing the molecular structure of graphene.
Figure 2B:
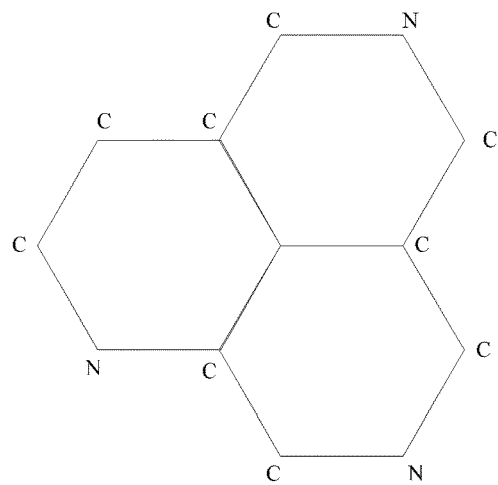
FIG. 2b is a schematic view showing the molecular structure of nitrogen-doped graphene.

FIG. 1a is a schematically plan view showing an array substrate provided by an embodiment of the present disclosure; FIG. 1b is a schematic view showing the sectional structure of the array substrate taken along the direction of line A-A' in FIG. 1a; FIG. 1c is a schematic view showing the sectional structure of the array substrate taken along the direction of line B-B' in FIG. 1a; FIG. 2a is a schematic view showing the molecular structure of graphene; FIG. 2b is a schematic view showing the molecular structure of nitrogen-doped graphene; FIGS. 3a to 4j are process flowcharts showing the manufacturing method of an array substrate provided by an embodiment of the present disclosure. In FIGS. 1a to 4j, only part of related structures are illustrated so as to make descriptions more clearly.

For example, as shown in FIGS. 1a and 1b, an array substrate according to an embodiment of the present disclosure includes a base substrate 1, an active layer 16 disposed on the base substrate 1, a first insulating layer 21 covering the active layer 16, and a first electrode 12, a second electrode 13 and a pixel electrode 10 that are disposed on the first insulating layer 12. The pixel electrode 10 and the second electrode 13 are electrically connected to each other.

For example, the base substrate 1 may be a transparent insulating substrate, and an example of material of the base substrate 1 may be a glass substrate, a quartz substrate, a plastic substrate or other suitable substrate.

For example, an example of material of the first insulating layer 21 includes silicon nitride (SiNx), silicon oxide (SiOx), aluminum oxide ($Al_2O_3$), aluminum nitride (AlN) or other suitable material, such as an organic resin material. For example, the first insulating layer 21 may be a single-layered structure formed of silicon nitride or silicon oxide, or a bilayered structure or a multilayered structure formed of silicon nitride and silicon oxide.

For example, in the first insulating layer 21, there are provided a first through hole 121 and a second through hole 131 that expose the active layer 16, and along the surface of the first insulating layer 21, there is provided a first recess 101. The first electrode 12 is electrically connected to the active layer 16 via the first through hole 121, the second electrode 13 is electrically connected to the active layer 16 via the second through hole 131; and the pixel electrode 10 is formed in the first recess 101.

For example, the array substrate further includes a common electrode 20 disposed on the base substrate 1, and the common electrode 20 is covered by the first insulating layer 21.

For example, the material of the common electrode 20 may be a graphene conductor, and the material of the active layer 16 may be a graphene-like semiconductor.

For example, as shown in FIG. 2a, the graphene conductor is such a conductive material that has a hexagonal, honeycomb crystal lattice, which consists of carbon atoms on sp2 hybridized orbitals, and a single-layered, flaky structure whose thickness is the same as that of only one carbon atom. The graphene conductor has good conductive property, stability, transparency, flexibility and other characteristics, and thus, conductivity, stability, transparency and flexibility of an array substrate can be enhanced accordingly.

For example, the graphene-like semiconductor is a semiconductor material obtained by modifying the chemical structure of a graphene conductor, and for example, it may be formed by controlling to substitute part of carbon atoms in the graphene conductor with atoms of substitution element(s). Thereby, this causes the conductive band and the valence band of the graphene conductor, whose conductive band and valence band originally overlap with each other, to separate from each other and have a certain bandgap therebetween, and the conductivity of the graphene conductor is reduced. As a result, the graphene conductor, whose conductive band and valance band originally overlap with each other, into a graphene-like semiconductor, whose conductive band and valance band are separate and have a certain bandgap therebetween, is realized. On the other hand, the graphene-like semiconductor is a graphene-like material obtained by modifying the chemical structure of a graphene conductor, and then, the graphene-like semiconductor is similar to the graphene conductor, and has good stability, flexibility and transparency. When the graphene-like semiconductor is bent, folded and rubbed, its valence bond will not be fractured. Therefore, the curvature property of the active layer 16 made from a graphene-like semiconductor can meet the requirement of a flexible display device.

For example, the substitution element may be at least one of various elements including fifth main group elements, sixth main group elements, seventh main group elements and lanthanide elements. For example, as shown in FIG. 2b, the substitution element may include nitrogen (N). For example, the process of doping graphene with N atoms may include the operation that N plasma is controlled to be in direct contact with graphene, thereby N plasma undergoes reaction with graphene; and in a corresponding positions in graphene, N atoms substitute part of carbon (C) atoms so as to form C—N bonds. Thus, a nitrogen-doped graphene including carbon atoms (C) and atoms N is obtained, namely, a graphene-like semiconductor. For another example, the substitution element may also be hydrogen (H) element, and graphene is subjected to hydrotreating with hydrogen gas, argon gas or a mixed gas of these two elements, so as to obtain a hydrogenated graphene semiconductor. It is to be noted that, the substitution element may also be other element, or other way may also be adopted to control the reaction of particles of the substitution element with graphene. Embodiments of the present disclosure do not set a limit to this.

For example, the first electrode 12 may be a source electrode, and accordingly, the second electrode 13 may be a drain electrode. However, the embodiment is not limited to this. The first electrode 12, for example, may also be a drain electrode, while the second electrode 13 is a source electrode.

For example, the pixel electrode 10 and the common electrode 20 may be plate-like electrodes, and may also be slit electrodes. For example, the pixel electrode 10 and the common electrode 20 may include a plurality of branch electrodes, namely, each of them has a comb-like structure, and the branches of the pixel electrode 10 and the branches of the common electrode 20, for example, overlap with each other or they are arranged to be staggered from each other. As shown in FIG. 1a, the pixel electrode 10 is a slit electrode, which includes a plurality of branch electrodes (e.g., in parallel to each other), and the branch electrodes are separated by slits. The common electrode 20 is a plate-like electrode. In an embodiment of the present disclosure, the pixel electrode 10 is formed over the common electrode 20, and the array substrate, for example, can be used for Advanced Super Dimension Switch (ADS) mode liquid crystal panels.

First Example

For example, as shown in FIGS. 1a and 1c, the array substrate further includes a gate electrode 14 disposed on the first insulating layer 21 and a gate line 11 disposed on the base substrate 1. The gate line 11 is covered by the first insulating layer 2. In the first insulating layer 21, there is further provided a third through hole 141 exposing the gate line 11, and at a surface of the first insulating layer 21, there is further provided a second recess 142. The gate electrode 14 is provided in the second recess 142 and the third through hole 141, and electrically connected to the gate line 11 via the third through hole 141.

For example, the gate line 11 and the common electrode 20 may be formed simultaneously. The material of the gate line 11 may be graphene as well, and thus, the gate line 11 has a relatively high conductivity. Consequently, the rate of transmitting scan signals of the gate line 11 can be increased, and the display quality is improved.

For example, as shown in FIG. 1a, the array substrate further includes a data line 15. The data line 15 extends in a Y direction, the gate line 11 extends in an X direction, these two lines intersect and are insulated from each other, and a thin film transistor, for example, is formed at the crossing position of these two lines. For example, the data line 15 may be disposed on the first insulating layer 21, so that the first electrode 12 and the data line 15 can be electrically connected to each other or formed in one integrated structure. Or, the data line 15 may be disposed on the base substrate 1 and covered by the first insulating layer 21 (as long as it is ensured that the data line 15 and the gate line 11 are disposed to be insulated from each other, for example, an insulating layer is arranged in the place where the two lines cross over each other, or individual segments of the data line 15 that are separated by the gate line 11 are electrically connected to each other by a bridge electrode), and in the first insulating layer 21, there may further included a through hole (not shown), via which, the first electrode 12 is electrically connected to the data line 15. Although only one pixel region is shown in the figure, those ordinarily skilled in the art can know that, the array substrate may include multiple pixel regions, which are arranged in an array to form a display region.

For example, material of the data line 15 may include a copper-based metal, an aluminum-based metal, a nickel-based metal or the like. For example, the copper-based metal is copper (Cu), an alloy of copper and zinc (CuZn), an alloy of copper and nickel (CuNi), an alloy of copper, zinc and nickel (CuZnNi), or other copper-based metallic alloy with stable performance.

For example, the first electrode 12, the active layer 16, the second electrode 13, the gate electrode 14 and the first insulating layer 21 altogether form a thin film transistor, which can function as a switching element for a pixel region defined by the data line 15 and the gate line 11. When an ON signal is applied to a gate line 11, the thin film transistor is turned on, so that a pixel electrode 10 is electrically connected to a data line 15, and a data signal applied to the data line 15 can be transferred to the pixel electrode 10; when an OFF signal is applied to the gate line 11, the thin film transistor is switched off, so that electrical connection between the pixel electrode 10 and the data line 15 is disconnected.

For example, the material for the first electrode 12, the second electrode 13, the pixel electrode 10 and the gate electrode 14 may be a transparent, conductive material, a metallic material or other suitable material, such as indium tin oxide (ITO), indium zinc oxide (IZO), indium oxide ($In_2O_3$), aluminum zinc oxide (AZO), carbon nanotube, and so on. For example, the first electrode 12, the second electrode 13, the pixel electrode 10 and the gate electrode 14 may each be made from indium tin oxide, and thus the array substrate can have a relatively high aperture ratio.

It is to be noted that, the first insulating layer 21, for example, may be formed on the base substrate 1 to cover the whole pixel region (or display region). However, in FIG. 1b, in order to illustrate the structure of these layers more clearly, only part of these layers are shown, but this does not mean that these layers are merely formed with the part. Similarly, for example, the pixel electrode 10 as well as the common electrode 20 and so on is also partially shown in FIG. 1b for reference.

In the following, the manufacturing method of the array substrate in the first example will be described in conjunction with FIG. 3a to FIG. 4j. FIGS. 3a to 3d, 3f to 3h, and 4a to 4j are still sectional views taken along the location of line A-A' shown in FIG. 1b. FIG. 3a to FIG. 4j still only show a part of related structures so as to make descriptions more clearly.

Figure 3A:
FIGS. 3a to 4j are process flowcharts showing the manufacturing method of an array substrate provided by an embodiment of the present disclosure.

For example, as shown in FIG. 3a, a base substrate 1 is provided, and a graphene conductor layer 40 is deposited on the base substrate 1.

For example, the graphene conductor layer 40 may be deposited by sputtering or thermal evaporation, and its thickness may be in the range of 5 nm to 100 nm. For example, the thickness of the graphene conductor layer 40 may be 30 nm, 50 nm, 80 nm or the like.

Figure 3B:
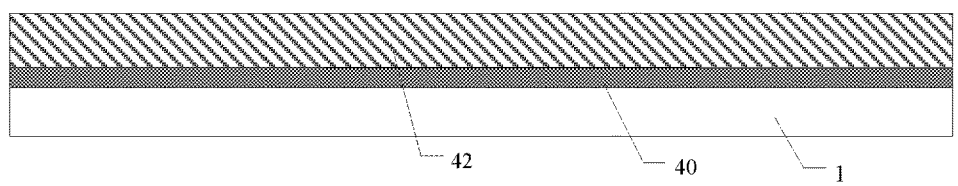

For example, as shown in FIG. 3b, a layer of photoresist 42 is deposited on the graphene conductor layer 40 by coating.

For example, a process of spin-coating, blade coating or roller coating may be adopted for coating of the photoresist 42.

Figure 3C:
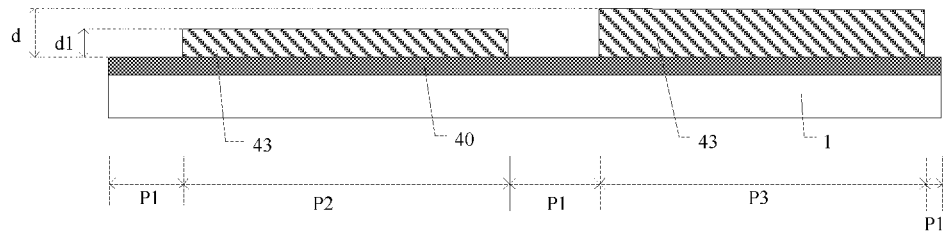

For example, as shown in FIG. 3c, an exposure process is conducted on the photoresist via a halftone or graytone mask, and then the exposed photoresist is subjected to development so as to form a first photoresist mask layer 43 including a photoresist fully-retained region P3, a photoresist half-retained region P2 and a photoresist fully-removed region P1.

It is to be noted that, the photoresist fully-retained region P3 is a region where the photoresist is retained entirely, and its thickness of photoresist is d; the photoresist half-retained region P2 is a region where the photoresist is partially retained, and its thickness of photoresist may be such as d1, which is smaller than d; and the photoresist fully-removed region P1 is a region where the photoresist is fully removed. It is to be pointed out that, the photoresist fully-retained region P3 merely shows that the photoresist in the region can substantially be retained after development or the reserved thickness is the maximum, but it is not limited to the case that the photoresist in it does not have any change after development.

Figure 3D:
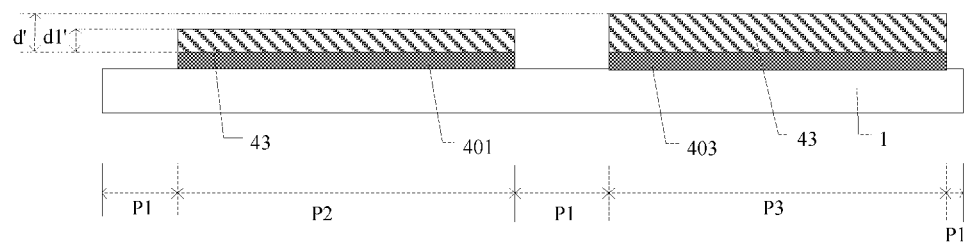
Figure 3E:
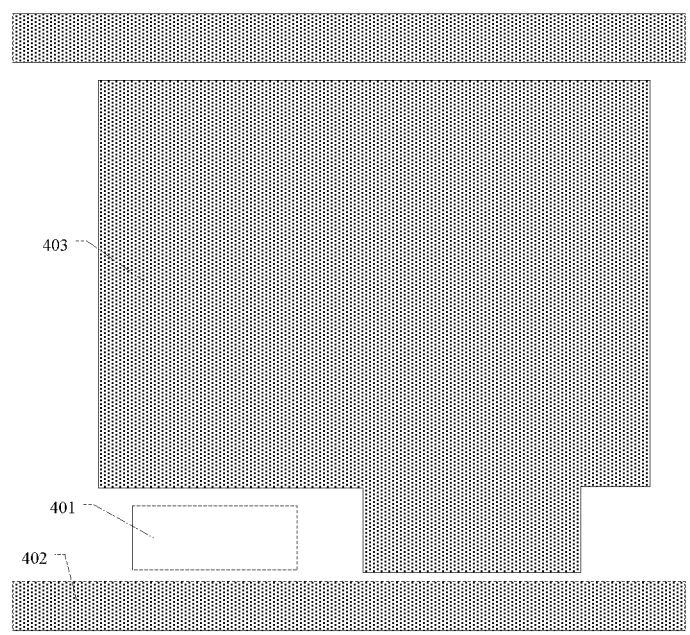

For example, as shown in FIGS. 3d and 3e, an etching process is performed on the graphene conductor layer 40 with the first photoresist mask layer 43 as a mask, so as to etch the graphene conductor layer 40 in the photoresist fully-removed region P1, and thereby a first area of graphene conductor layer 401, a second area of graphene conductor layer 402 and a third area of graphene conductor layer 403 that are insulated from one another are formed. It is to be noted that, the first area of graphene conductor layer 401 lies in the photoresist half-retained region P2, and the second area of graphene conductor layer 402 and the third area of graphene conductor layer 403 both lie in the photoresist fully-retained region P3, but are separated from each other.

For example, the second area of graphene conductor layer 402 is used for forming a gate line 11, and the third area of graphene conductor layer 403 is used for forming a common electrode 20.

For example, dry etching or wet etching may be used for the etching process. For example, for dry etching, a chemical method (e.g., plasma etching (PE)), a physical method (e.g., ion etching (IE)) or a method combining physics and chemistry effects (e.g., reactive ion etching (RIE)) may be adopted. For example, an ion beam etching (IBE) may also be used for the etching process, and it has the characteristics of good directionality, anisotropy, high resolution, high steepness, no restriction upon etching material and so on, whereby precise etching can be accomplished.

For example, as shown in FIG. 3d, if an ion beam etching is adopted, then owing to the vertical bombardment of plasma, photoresist within the photoresist fully-retained region P3 and the photoresist half-retained region P2 are thinned in thickness to be d1' and d', respectively, and d1'<d1, d'<d.

Figure 3F:
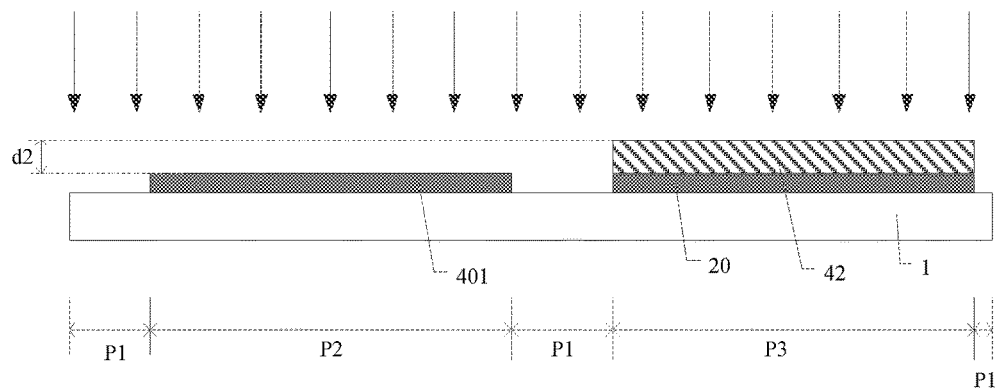
Figure 3G:
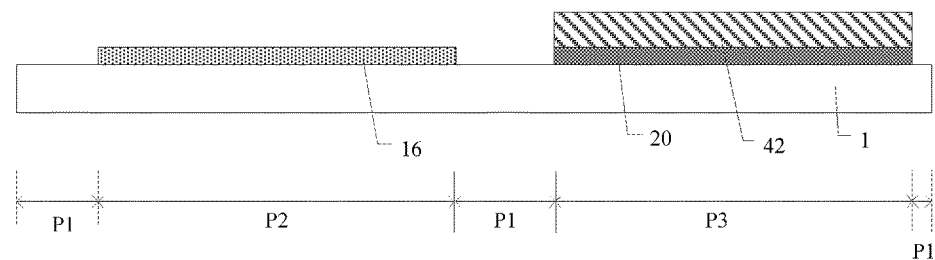

For example, as shown in FIGS. 3f and 3g, the photoresist half-retained region P2 is etched with IBE technology to remove the photoresist 42 within the photoresist half-retained region P2, so that the first area of graphene conductor layer 401 is exposed out; next, with the photoresist 42 within the photoresist fully-retained region P3 as a barrier mask, part of carbon (C) atoms in the first area of graphene conductor layer 401 are substituted with atoms of a substitution element under control in a plasma condition, whereby an active layer 16 is formed.

For example, the substitution element may be N atoms. Under plasma condition, nitrogen gas ($N_2$) is introduced to the surface of the first area of graphene conductor layer 401 that has been exposed out, so as to obtain N plasma; N plasma is controlled so as to be in direct contact with the first area of graphene conductor layer 401, thereby a reaction is produced. N atoms substitute part of C atoms to form C—N bonds, and this causes conductive band and valence band of graphene whose conductive band and valence band originally overlap each other to separate. In this way, a certain bandgap is formed, and its conductivity is reduced. Consequently, a graphene-like semiconductor is obtained, and then an active layer 16 is formed. It is to be noted that, the substitution element may also be other element, or other method may also be adopted to control the reaction of atoms of the substitution element with graphene. The present embodiment is not limited in this aspect.

It is to be noted that, in the manufacturing method shown in FIGS. 3f and 3g, IBE technology is employed to remove the photoresist 42 within the photoresist half-retained region P2, rather than an ashing process. In the ashing process, dry etching is mainly used to remove photoresist, and the photoresist 42 is removed during this process through chemical reaction. For example, dry ashing process can make use the phenomenon that highly reactive atomic oxygen in plasma is very prone to create a polymerization reaction with the polymer compound of carbon, hydrogen and oxygen in the photoresist 42, producing volatile reactants. The object of removing the photoresist 42 is ultimately achieved. However, the main constituent in the first area of graphene conductor layer 401 is carbon atoms, which are very prone to create a reaction with highly reactive atomic oxygen in the oxygen plasma, resulting in that the first area of graphene conductor layer 401 is changed in property or is partially etched. Thus, the quality of an active layer 16 that is formed by the first area of graphene conductor layer 401 is affected, and in turn, the quality of the array substrate is affected. While IBE technology adopts ion beams with certain energy (e.g., Ar, Kr or Xe ions) to bombard the surface of material, so that atoms of the material undergo effect of being sputtered, and thus the purpose of etching is achieved. It is a purely physical process, and so carbon atoms in the graphene conductor layer 40 will not react with the ions. Thereby, the property of the graphene conductor layer 40 is kept unchanged. Moreover, IBE technology has the characteristics of high resolution, anisotropy and so on, and the etched thickness of the photoresist 42 can be precisely controlled accordingly, so as to prevent the first area of graphene conductor layer 401 from being etched.

It is to be noted that, as shown in FIGS. 3f and 3g, owing to the vertical bombardment of plasma, photoresist 42 within the photoresist fully-retained region P3 is further thinned in thickness to be d2, and d2<d'. The photoresist 42 is thinned in its thickness after two processes of plasma bombardments. In order to guarantee the etching process and prevent the graphene layer from being etched incompletely, or when the first area of graphene conductor layer 401 is treated, in order to prevent the second area of graphene conductor layer 402 and the third area of graphene conductor layer 403 from being exposed as well, the thickness of the photoresist 42 needs to be relatively thick. For example, it may be in the range of 2.5 μm to 3 μm, and for example, it may be 3 μm.

Figure 3H:
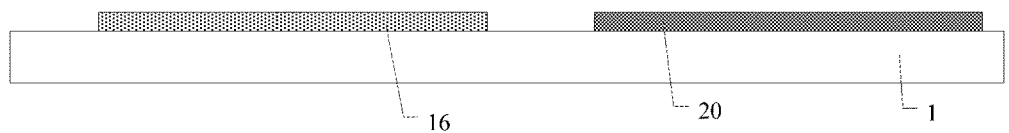
Figure 3I:
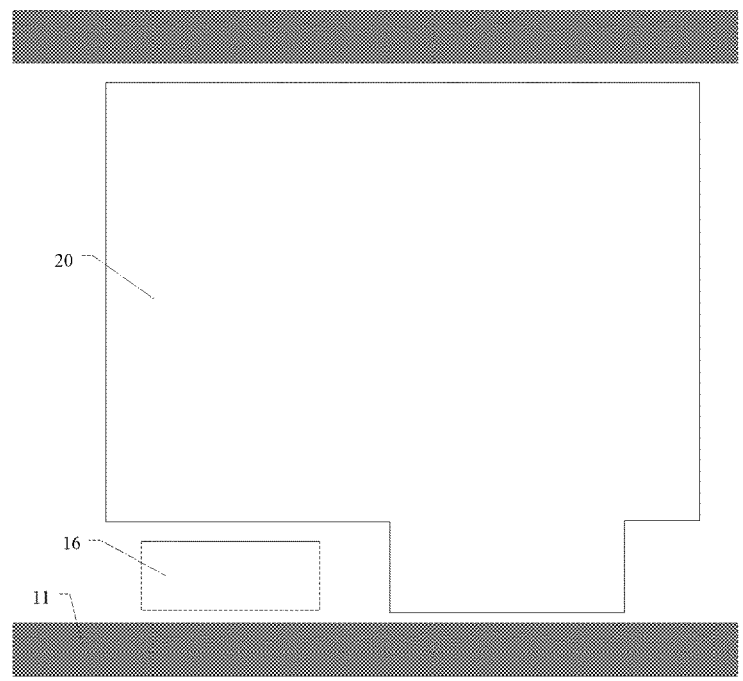

For example, as shown in FIGS. 3h and 3i, photoresist within the photoresist fully-retained region P3 is removed by using a stripping process, so as to form the active layer 16, the common electrode 20 and the gate line 11 on the base substrate 1.

Figure 4A:
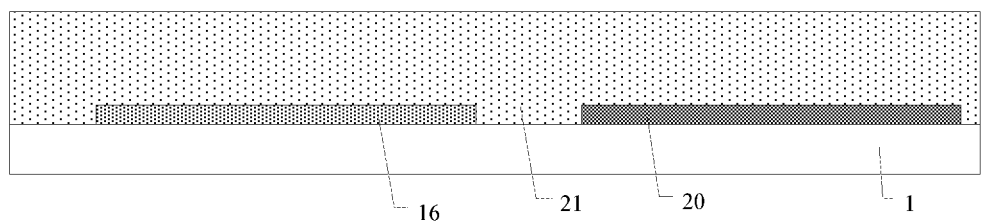

For example, as shown in FIG. 4a, an insulating layer thin film is deposited on the active layer 16, the common electrode 20 and the gate line 11, so as to form a first insulating layer 21.

For example, the thickness of the first insulating layer 21 may be in the range of 600 nm to 1500 nm, and for example, it may be 800 nm or 1000 nm.

For example, for the deposition of the insulating layer thin film, chemical vapor deposition (CVD), such as plasma enhanced chemical vapor deposition (PECVD), low pressure chemical vapor deposition (LPCVD) or the like may be used, and it may also be physical vapor deposition (PVD) or the like.

For example, as shown in FIGS. 4b to 4g, one patterning process is performed on the first insulating layer 21, so that a first through hole 121 and a second through hole 131 that expose the active layer 16, and a third through hole 141 (not shown in the cross section, but referred to the first through hole 121 or the second through hole 131) exposing the gate line 11 are formed in the first insulating layer 21, and a first recess 101 and a second recess 142 are formed at a surface of the first insulating layer 21.

For example, the one patterning process includes a photolithography process with a graytone mask or a halftone mask, and it may include the following steps.

Figure 4B:
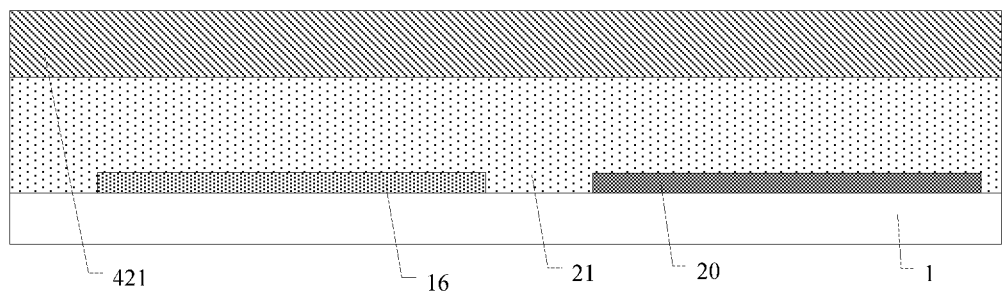

Step 1, as shown in FIG. 4b, a layer of photoresist 421 is coated on the first insulating layer 21.

Figure 4C:
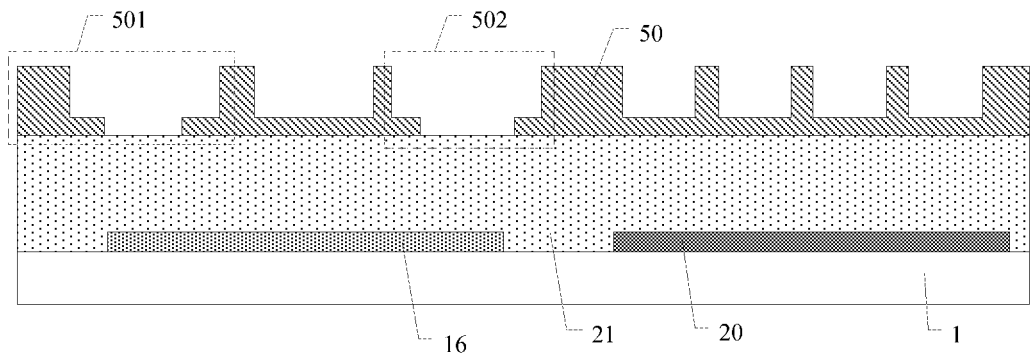

Step 2, as shown in FIG. 4c, exposure is conducted on the photoresist with a graytone mask or halftone mask, and then the exposed photoresist is developed so as to form a second photoresist mask layer 50. For example, a first area 501 and a second area 502 of the second photoresist mask layer 50 correspond to regions where a first electrode 12 and a second electrode 13 will be formed, respectively. The first area 501 and the second area 502 include photoresist fully-retained regions at two edges, photoresist fully-removed regions in the middle, and photoresist half-retained regions between the photoresist fully-retained regions and the photoresist fully-removed regions. It is to be noted that, the photoresist fully-retained regions, the photoresist half-retained regions and the photoresist fully-removed regions may be the same as those described above.

Figure 4D:
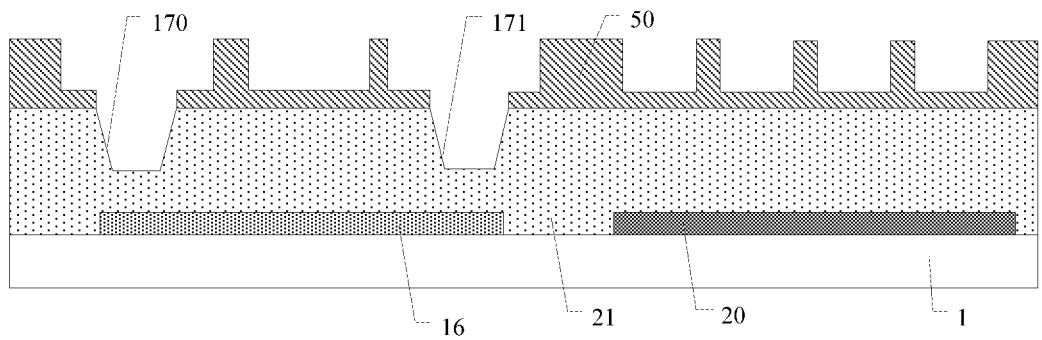

Step 3, as shown in FIG. 4d, with the second photoresist pattern 50 as a barrier mask, a first blind hole 170, a second blind hole 171 and the a third blind hole (not shown) are formed in the first insulating layer 21 by using a first etching process.

Figure 4E:
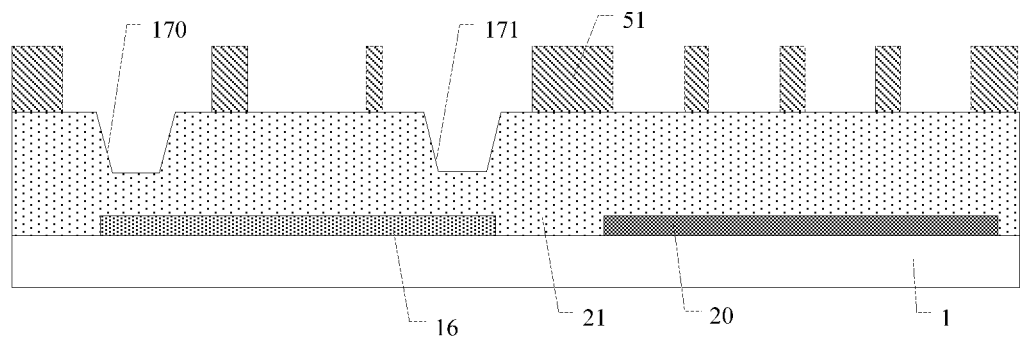

Step 4, as shown in FIG. 4e, the photoresist in the photoresist half-retained regions is removed by using an ashing process, thereby obtaining a third photoresist mask layer 51.

Figure 4F:
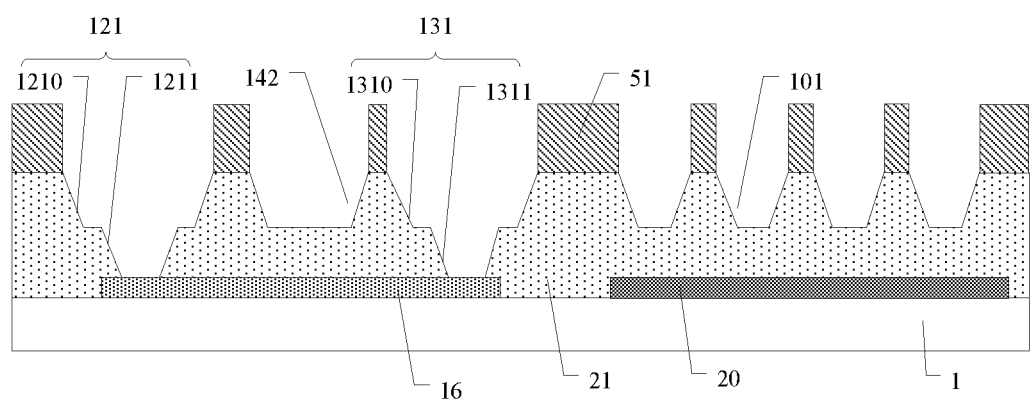

Step 5, as shown in FIG. 4e and FIG. 4f, with photoresist within the photoresist fully-retained regions as a barrier mask, the first through hole 121, the second through hole 131 that expose the active layer 16 and the third through hole 141 (not shown) exposing the gate line 11 are formed at the locations of the first blind hole 170, the second blind hole 171 and the third blind hole by using a second etching process, respectively, and meanwhile a second recess 142 that lies between the first through hole 121 and the second through hole 131 and a first recess 101 are also formed. Here, the first to third through holes each have a step between an upper part, the cross section of which is a wider, inverted trapezoid, and a lower part, the cross section of which is a narrower, inverted trapezoid.

Figure 4G:
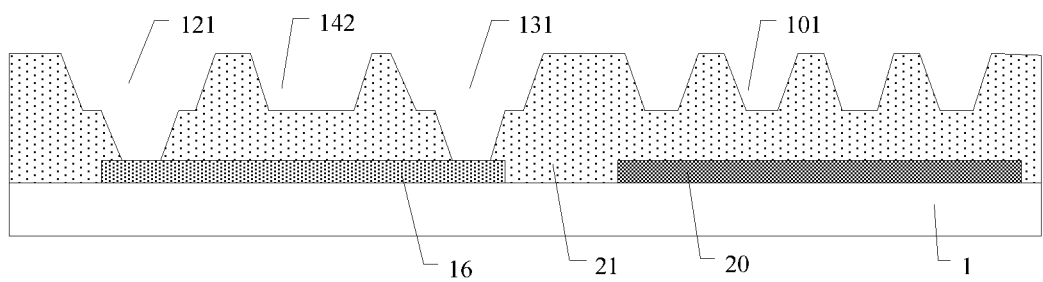

Step 6, as shown in FIG. 4g, the remaining photoresist is removed by using a stripping process, so as to form the desired structure.

In the present embodiment, the first electrode 12, the second electrode 13, the gate electrode 14 and the pixel electrode 10 are located on the same layer (e.g., the first insulating layer 21). As compared to layered fabrication, the above structure not only simplifies the manufacturing process, but also can decrease the thickness of the array substrate to realize an ultra-thin display apparatus.

For example, the first recess 101 may include a plurality of branch recesses, so that the pixel electrode 10 formed with the help of the first recess 101 has a plurality of narrow branch electrodes. Certainly, the first recess 101 may also be formed as one wide recess, and the pixel electrode 10 formed thereby is a plate-like electrode.

For example, as for the first etching process, an inductively coupled plasma (ICP) etching technology may be adopted for etching with SF6 gas as an etching gas. For example, it is possible that by adjusting etching parameters, the first blind hole 170, the second blind hole 171 and the third blind hole are made to have smooth sidewalls and flat slopes, and the etching parameters may be, such as, working pressure, power, proportions of etching gases and so on of the ICP etching equipment. For example, as for the second etching process, an inductively coupled plasma (ICP) etching technology may be adopted for etching as well. It is to be noted that other etching technology may also be adopted for the first etching process and the second etching process, and the embodiment is not limited in this aspect.

For example, the first through hole 121 and the second through hole 131 may be stepped holes. The first through hole 121 may include a first portion 1210 on a side far away from the base substrate 1 and a second portion 1211 on a side close to the base substrate 1, and the aperture of the first portion 1210 is greater than the aperture of the second portion 1211, so that the first through hole 121 has the shape of an inverted trapezoid. The second through hole 131 may include a third portion 1310 far away from the base substrate 1 and a fourth portion 1311 close to the base substrate 1, and the aperture of the third portion 1310 is greater than the aperture of the fourth portion 1311, so that the second through hole 131 has the shape of an inverted trapezoid as well. For example, as shown in FIG. 2c, the third through hole 141 may be a stepped hole in the shape of an inverted trapezoid as well. For example, the depths of the first portion 1210 of the first through hole 121, the third portion of the second through hole 131, the first recess 101 and the second recess 142 may be in the range of 500 nm to 800 nm, and for example, it may be 600 nm.

Figure 4H:
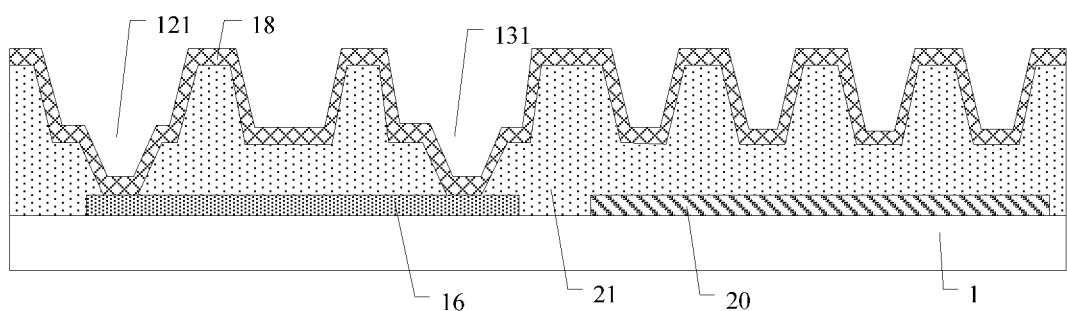

For example, as shown in FIG. 4h, a conductive layer 18 is deposited on the first insulating layer 21, and it can fill in the first through hole 121, the second through hole 131, the third through hole, the first recess and the second recess. For example, the thickness of the conductive layer 18 may be in the range of 40 nm to 200 nm, and for example, it may be 100 nm.

For example, the deposited conductive layer 18 may be formed by adopting a vapor deposition method, a magnetron sputtering method, a vacuum evaporation method or other suitable treatment.

For example, the material of the conductive layer 18 may be a transparent, conductive material or other suitable material, such as, indium tin oxide (ITO), indium zinc oxide (IZO), carbon nanotube and the like.

Figure 4I:
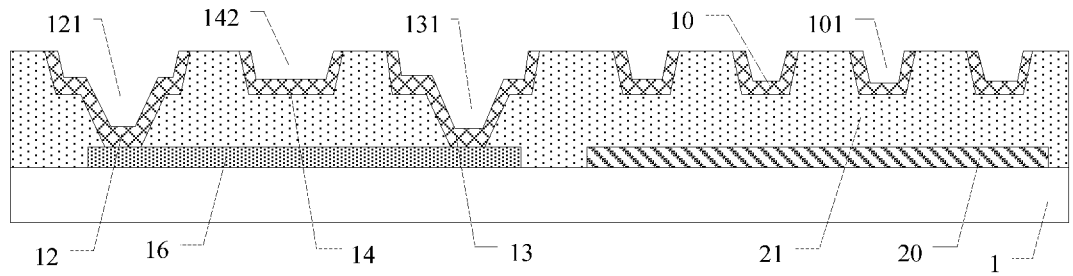

For example, as shown in FIG. 4h and FIG. 4i, a grinding process is performed on the array substrate manufactured as above, so as to remove the conductive layer 18 on a surface of the first insulating layer 21, and to retain the conductive layer 18 at the first through hole 121, the second through hole 131, the first recess 101, the third through hole 141 and the second recess 142. Thus, a first electrode 12, a second electrode 13, a pixel electrode 10 and a gate electrode 14 are formed respectively. The first electrode 12 electrically contacts the active layer 16 via the first through hole 121, the second electrode 13 electrically contacts the active layer 16 via the second through hole 131, and the gate electrode 14 is electrically connected to a gate line via the third through hole.

For example, the grinding process may be a chemical mechanical polishing (CMP) process, in which, a uniform surface is obtained by removing the parts in a higher place at a speed faster than that for removing the parts in a lower place, and by which, the array substrate can be precisely and uniformly polished to have the desired thickness and flatness. For example, through the CMP process, the thicknesses of protruding portions on the two sides of the first through hole 121, the second through hole 131, the third through hole 141, the first recess 101 and the second recess 142 are removed by, such as 300 nm or so, and then the conductive layer 18 on the surface of the first insulating layer 21 are divided into several regions that are disconnected from each other. In this way, without a masking process, the first electrode 12, the second electrode 13, the pixel electrode 10, the gate electrode 14 and so on can be formed, and they are insulated from one another.

It is to be noted that the amount of the removed thickness of protruding portions on the two sides of the first through hole 121, the second through hole 131, the third through hole 141, the first recess 101 and the second recess 142 by using a grinding process is positively proportional to the depths of the first recess 101 and the second recess 142 and the thickness of the conductive layer 18. For example, if the depths of the first recess 101 and the second recess 142 are 600 nm and the thickness of the conductive layer 18 is 100 nm, then the removed thickness may be greater than 100 nm and smaller than 700 nm. Thus, it can be ensured that the conductive layer 18 is divided into several regions that are insulated from each other and the conductive layer 18 within the first recess 101 and the second recess 142 can be retained partially or wholly to form the pixel electrode 10 and the gate electrode 14.

Figure 4J:
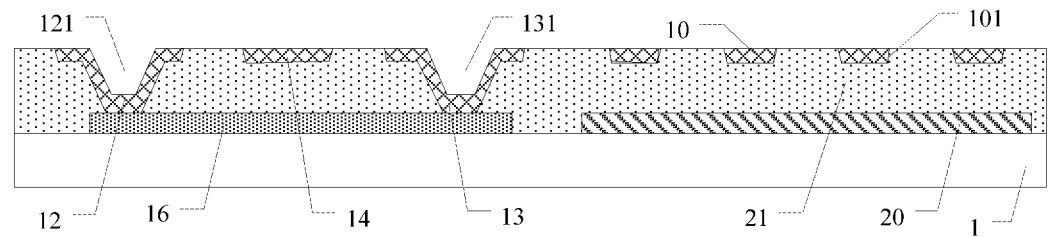

For example, as shown in FIG. 4j, after grinding process is performed on the first insulating layer 21 with the conductive layer deposited thereon, a flat surface can be obtained.

It is to be noted that, when the first through hole 121 is formed by the first patterning process, a fourth recess integral with the first through hole 121 may also be formed; after the grinding process, the conductive layer 18 is retained in the fourth recess to form a data line 15.

In this example, the active layer 16 is made from a transparent, graphene-like semiconductor, and the first electrode 12, the second electrode 13, the gate electrode 14, the data line 15 and the pixel electrode 10 are made from a transparent, conductive material. Therefore, aperture ratio of the array substrate can be increased.

In the first example, the material of the active layer 16 is a graphene-like semiconductor, the material of the gate line 11 and the common electrode 20 is graphene. Based on doping to graphene, the active layer 16, the gate line 11 and the common electrode 20 are formed by using one masking process, and thus the array substrate can be fabricated by using two masking processes.

Second Example

The structure of an array substrate provided by this example may be basically the same as that of the first example.

It is to be noted that, different from the first example, in this example, the material of an active layer 16 may also be, such as, amorphous silicon, polysilicon, an oxide semiconductor or other suitable material. The polysilicon may be a high-temperature polysilicon or a low-temperature polysilicon, and the oxide semiconductor, for example, may be indium gallium zinc oxide (IGZO), indium zinc oxide (IZO), zinc oxide (ZnO), gallium zinc oxide (GZO) or the like. For example, the material of a gate line 14 and a common electrode 20 may also be a transparent conductive material, a metallic material or other suitable material. For example, the material of the gate line 14 and the common electrode 20 may be indium tin oxide (ITO), indium zinc oxide (IZO) or the like.

Figure 5A:
FIGS. 5a to 5b are process flowcharts showing the manufacturing method of another array substrate provided by an embodiment of the present disclosure.
Figure 5B:
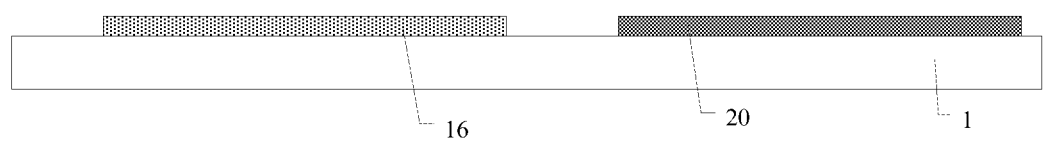

FIGS. 5a to 5b are process flowcharts showing the manufacturing method of an array substrate provided by the present example.

The manufacturing method of the array substrate provided by the present example may be substantially similar to manufacturing method of the first example. In this example, as shown in FIG. 5a, firstly by one masking process, a common electrode 20 and a gate line 11 insulated from each other is formed on a base substrate 1; as shown in FIG. 5b, next by using one more masking process, an active layer 16 is formed on the base substrate 1. Steps after formation of the active layer 16 may be the same as those in the first example, and thus the array substrate in this example can be formed by using three masking processes.

Third Example

Figure 6A:
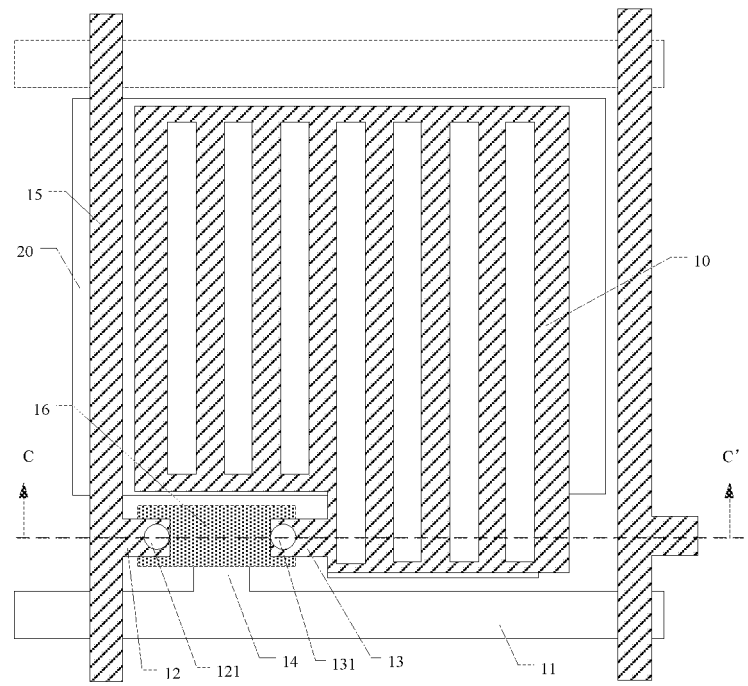
FIG. 6a is a schematically plan view showing an array substrate provided by still another embodiment of the present disclosure.
Figure 6B:
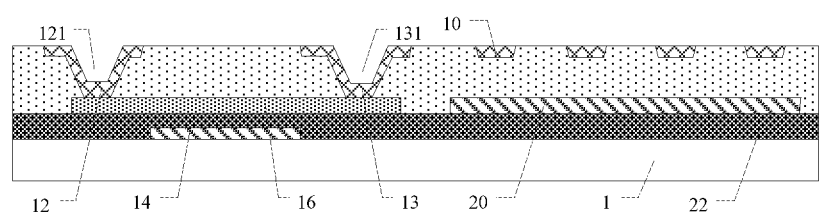
Figure 6C:
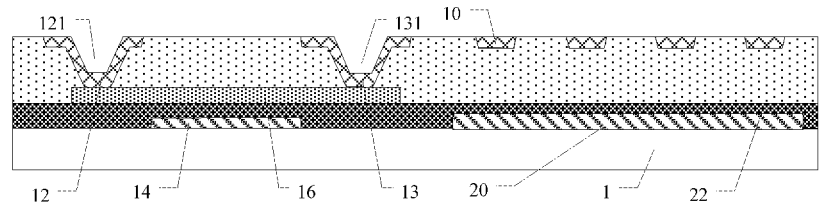

In the first example and the second example, array substrates adopt top-gate type thin film transistors, but the present embodiment is not limited to this. Rather, an array substrate may also adopt bottom-gate type thin film transistors. FIG. 6a is a schematically plan view showing an array substrate provided by the present example;

FIG. 6b is a schematic view showing the sectional structure of an example of the array substrate taken along the direction of line C-C' in FIG. 6a; FIG. 6c is a schematic view showing the sectional structure of another example of the array substrate taken along the direction of line C-C' in FIG. 6a.

For example, as shown in FIG. 6a and FIG. 6b, a gate electrode 14 and a gate line 11 are disposed on a base substrate 1. For example, the gate line 11 and the gate electrode 14 may be electrically connected to each other or integrally formed, and the gate electrode 14, for example, is formed to branch off from the gate line 11, thereby a scan signal is applied to the gate electrode 14 through the gate line 11. The gate electrode 14 and an active layer 16 at least partially overlap in a direction perpendicular to the base substrate 1.

For example, the material of the gate electrode 14 and the gate line 11 may include a copper-based metal, an aluminum-based metal, a nickel-based metal, a combination of chromium and other metal, or the like.

For example, as shown in FIGS. 6a to 6c, the array substrate further includes a second insulating layer 22, which covers the gate electrode 14 and the gate line 11, and on which, an active layer 16 is formed. For example, the material of the second insulating layer 22 may include silicon nitride (SiNx), silicon oxide (SiOx), silicon oxynitride (SiNxOy) or other suitable material. For example, the second insulating layer 22 may be a single-layered structure or a multilayered structure composed of one or more of the above materials. The relative position of other layers of the array substrate in this example may be the same as that in the first example, and the material for fabrication of the other layers may also be the same as that in the first example, details being omitted here.

It is to be noted that, in this example, in a direction perpendicular to the base substrate 1, the gate electrode 14 is disposed below the active layer 16 and the two overlap at least partially. So, the light emitted from the side of the base substrate 1 can be blocked from being irradiated onto the active layer 16 by the gate electrode 14. Consequently, the leakage current of thin film transistors is decreased, and the performance of thin film transistors is improved.

In the manufacturing method of the array substrate provided by this example, firstly by one masking process, a gate electrode 14 and a gate line 11 are formed on a base substrate 1, then an insulating layer thin film is deposited on the base substrate 1 with the gate electrode 14 and the gate line 11 formed thereon, so as to form a second insulating layer 22, and then, an active layer 16 is formed on the second insulating layer 22. Steps of forming the active layer 16 and other layers may be the same as those in the first example. Before, while or after the active layer 16 is formed, a common electrode 20 may also be formed. In case of forming the common electrode 20 before or after the active layer is formed, for example, one separate masking process may be used to form the common electrode 20; while in case of forming the common electrode 20 at the same time when the active layer 16 is formed, for example, the manner in the first example may be adopted, i.e., a common electrode 20 and an active layer 16 are obtained by a graphene conductor and a graphene-like semiconductor, respectively.

Or again, as shown in FIG. 6c, a common electrode 20 may be formed at the same time when a gate line 11 and a gate electrode 14 is formed, and in this case, the common electrode 20 is formed on the same layer as the gate line 11 and the gate electrode 14, and also covered by the second insulating layer 22.

Embodiment 2

Figure 7A:
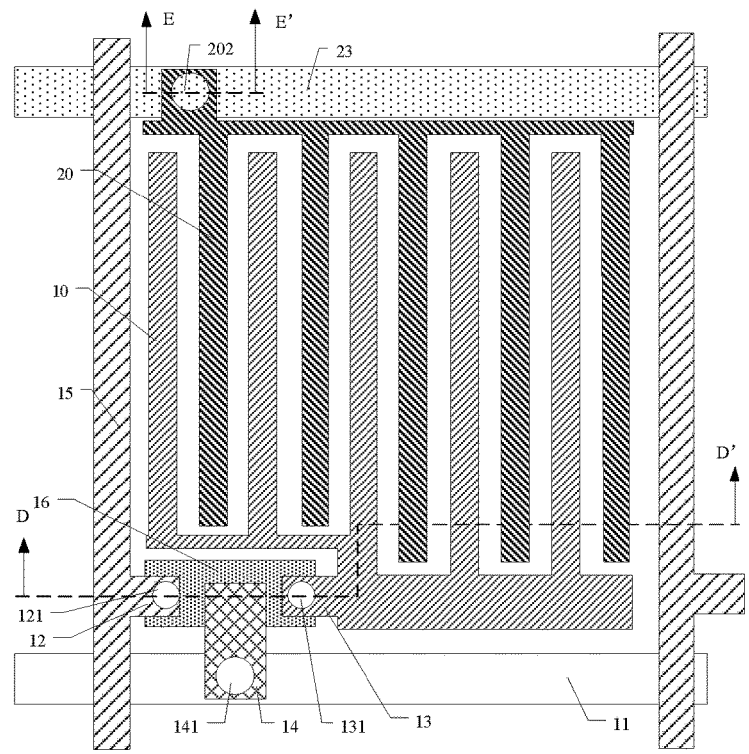
FIG. 7a is a schematically plan view showing an array substrate provided by another embodiment of the present disclosure.
Figure 7B:
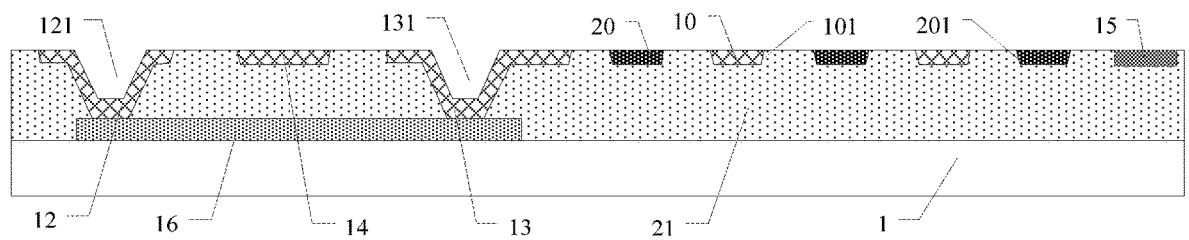
Figure 7C:
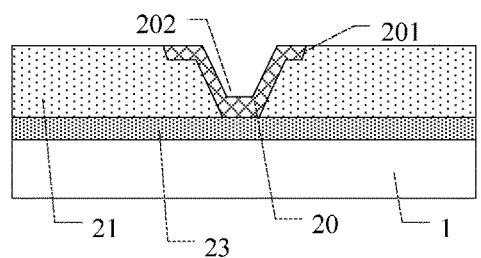

FIG. 7a is a schematically plan view showing an array substrate provided by the present embodiment; FIG. 7b is a schematic view showing sectional structure of the array substrate taken along the direction of line D-D' in FIG. 7a; FIG. 7c is a schematic view showing sectional structure of the array substrate taken along the direction of line E-E' in FIG. 7a.

It is to be noted that, as shown in FIGS. 7a to 7c, in the following descriptions of the present embodiment, an array substrate will be described by using top-gate type thin film transistors for example, but bottom-gate type thin film transistors can also be employed by the array substrate of the embodiment.

For example, as shown in FIGS. 7a and 7b, in the array substrate provided by the present embodiment, a pixel electrode 10 and a common electrode 20 are located on the same layer, namely, they are located on the first insulating layer 21, and at least partially staggered with each other. For example, each of the pixel electrode 10 and the common electrode 20 is of a comb-like structure, and branches of the pixel electrode 10 and branches of the common electrode 20 are arranged to be alternate with each other.

For example, the common electrode 20 may be a single-layered or multilayered structure formed by using a transparent, conductive material, a metallic material or other suitable material; for example, the material of the common electrode 20 may include indium tin oxide (ITO), indium zinc oxide (IZO), indium gallium oxide (IGO), gallium zinc oxide (GZO), zinc oxide (ZnO), indium oxide ($In_2O_3$), aluminum zinc oxide (AZO), carbon nanotube and so on.

For example, as shown in FIGS. 7a and 7c, the array substrate further includes a common electrode line 23 disposed on the base substrate 1, which is covered by the first insulating layer 21, on the first insulating layer 21, there is further provided a fourth through hole 202 exposing the common electrode line 23, and at a surface of the first insulating layer 21, there is further provided a third recess 201. The common electrode 20 is disposed in the third recess 201 and the fourth through hole 202, and electrically connected to the common electrode line 23 via the fourth through hole 202. For example, the material of the common electrode line 23 may be the same as that of the gate line 11. The structure and material of other layers of the array substrate of the embodiment may be the same as those in Embodiment 1.

The array substrate in the embodiment, for example, may be used for an in-plane switching (IPS) mode liquid crystal panel.

For example, in the manufacturing method of the array substrate provided by the present embodiment, upon formation of a gate line 11, a common electrode line 23 extending in parallel to the gate line 11 may be formed together, and when a first through hole 121 and a second through hole 131 are formed, a fourth through hole 202 exposing the common electrode line 23 and a third recess at a surface of the first insulating layer 21 are also formed at the same time. The conductive layer 18 may also fill in the third recess 201 and the fourth through hole 202, and after subjected to a grinding process, the conductive layer 18 is retained in the third recess 201 and the fourth through hole 202 to form the common electrode 20, which is electrically connected to the common electrode line 23 via the fourth through hole 202. The manufacturing method of other layers of the array substrate in the present embodiment may be the same as those in Embodiment 1, and details are omitted here.

For example, the third recess 201 may include a plurality of branch recesses, so that a common electrode 20 formed with aid of the third recess 201 has multiple branch electrodes.

Embodiment 3

Figure 8:
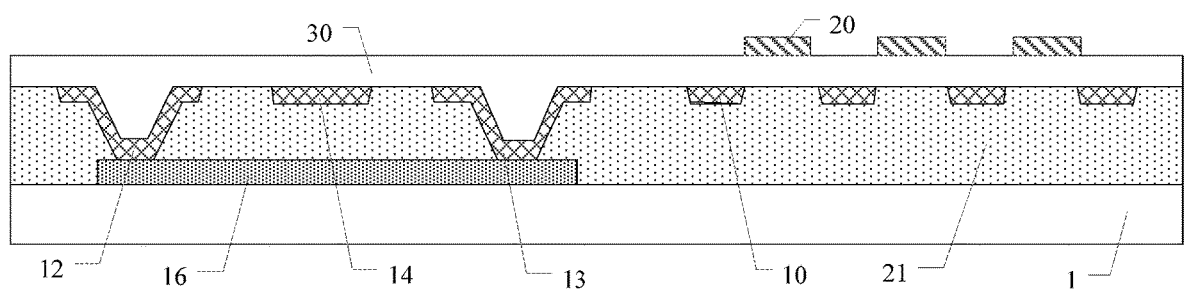
FIG. 8 is a schematic view showing the sectional structure of an array substrate provided by an embodiment of the present disclosure.

FIG. 8 is a schematic view showing the sectional structure of an array substrate provided by the present embodiment.

It is to be noted that, as shown in FIG. 8, the array substrate in the embodiment will be described by taking top-gate type thin film transistors for example, but bottom-gate type thin film transistors can also be employed by the array substrate of the embodiment.

For example, in the array substrate provided by the embodiment, a common electrode 20 is located over a pixel electrode 10. As shown in FIG. 8, the array substrate further includes a passivation layer 30, which cover a first electrode 12, a second electrode 13, a gate electrode 14 and the pixel electrode 10, and the common electrode 20 is disposed on the passivation layer 30. For example, the common electrode 20 may be a slit electrode.

For example, the material of the passivation layer 30 may include silicon nitride (SiNx), silicon oxide (SiOx), silicon oxynitride (SiNxOy) or other suitable material.

The array substrate in the embodiment, for example, may also be used for an ADS mode liquid crystal panel.

In the manufacturing method of the array substrate provided by the present embodiment, an insulating layer thin film is deposited on a first insulating layer 21 with the first electrode 12, the second electrode 13, the gate electrode 14 and the pixel electrode 10 formed thereon so as to form the passivation layer 30; next, a transparent, conductive material is deposited on the passivation layer 30 and patterned to form the common electrode 20. The manufacturing method of other layers of the array substrate in the embodiment may be the same as that in Embodiment 1, and details are omitted here.

Embodiment 4

According to the present embodiment, there is provided a display apparatus, which includes an array substrate provided by any of the above-mentioned embodiments. The display apparatus may be a display device such as a liquid crystal display apparatus, an electronic paper, an organic light emitting diode display apparatus or the like, and any product having display function such as a television, a digital camera, a cell phone, a watch, a tablet computer, a notebook computer, a navigator or the like that includes these display devices.

For example, an example of the display apparatus is a liquid crystal display apparatus, in which, an array substrate and a counter substrate are disposed oppositely to form a liquid crystal cell with a liquid crystal material filled therein. The counter substrate is a color filter substrate for example. A pixel electrode of each of the pixel units of the array substrate acts to apply an electric field to control the degree of rotation of the liquid crystal material so as to perform a display operation. In some examples, the liquid crystal display apparatus further includes a backlight source for providing the array substrate with backlight.

Another example of the display apparatus is an organic electroluminescent display apparatus (OLED), in which, a lamination of organic luminous materials is formed on an array substrate, and a pixel electrode of each of pixel units functions as an anode electrode or a cathode electrode and is used for driving the organic luminous materials to give off light so as to perform a display operation.

Still another example of the display apparatus is an electronic paper display apparatus, in which, an electronic ink layer is formed on an array substrate, and a pixel electrode of each of pixel units acts to apply such a voltage that is used for driving charged micro-particles in the electronic ink to move so as to perform a display operation.

A manufacturing method of an array substrate, an array substrate and a display apparatus are provided by embodiments of the present disclosure. In the manufacturing method of the array substrate of these embodiments, the array substrate can be manufactured by using two or three masking process, and the number of masking process required for manufacturing of the array substrate is decreased. As a result, the manufacturing flow of the process is simplified, the complexity degree of process and the manufacturing cost are lowered, fabricating time is shortened, production efficiency is enhanced, and yield of product is promoted.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged. However, it should understood that, in the case in which a component or element such as a layer, film, area, substrate or the like is referred to be "on" or "under"

another component or element, it may be directly on or under the another component or element or a component or element is interposed therebetween.

(3) In case of no conflict, features in one embodiment or in different embodiments can be combined.

What are described above is related to the illustrative embodiments of the disclosure only and not limitative to the scope of the disclosure; the scopes of the disclosure are defined by the accompanying claims.

What is claimed is:

1. A manufacturing method of an array substrate, comprising:
   providing a base substrate;
   sequentially forming an active layer and a first insulating layer that covers the active layer on the base substrate;
   performing one patterning process on the first insulating layer, so as to form a first through hole and a second through hole that expose the active layer in the first insulating layer, and form a first recess at a surface of the first insulating layer;
   forming a conductive layer on the patterned first insulating layer, with the conductive layer being filled in the first through hole, the second through hole, and the first recess;
   conducting a grinding process to remove the conductive layer on the surface of the first insulating layer and retain the conductive layer in the first through hole, the second through hole, and the first recess, whereby a source electrode, a drain electrode, and a pixel electrode are formed, respectively; and
   forming a third recess at the surface of the first insulating layer, and retaining the conductive layer in the third recess to form a common electrode.

2. The manufacturing method of the array substrate claimed as claim 1, wherein the forming the active layer comprises,
   forming a graphene conductor layer on the base substrate; and
   conducting a treatment on the graphene conductor layer, to control substitution of part of carbon atoms in the graphene conductor layer with atoms of a substitution element, thus converting the graphene conductor layer into a graphene-like semiconductor layer, whereby the active layer is formed on the base substrate.

3. The manufacturing method of the array substrate claimed as claim 2, wherein the graphene conductor layer includes a first area and a second area insulated from each other, and the first area is treated to form the active layer, and the second area is used for forming a gate line.

4. The manufacturing method of the array substrate claimed as claim 3, wherein the graphene conductor layer further includes a third area insulated from both the first area and the second area, and the third area is used for forming the common electrode.

5. The manufacturing method of the array substrate claimed as claim 2, wherein the conducting the treatment on the graphene conductor layer comprises:
   coating a photoresist on the graphene conductor layer;
   conducting exposure of the photoresist with a graytone mask or a halftone mask, then performing development of exposed photoresist, so as to form a photoresist mask layer including a photoresist fully-retained region, a photoresist half-retained region, and a photoresist fully-removed region;
   etching the photoresist half-retained region so as to expose the graphene conductor layer;
   controlling the substitution of the part of the carbon atoms in the graphene conductor layer with the atoms of the substitution element under plasma condition, wherein the substitution element is at least one of various elements including a fifth main group element, a sixth main group element, a seventh main group element, and a lanthanide element; and
   removing the photoresist.

6. The manufacturing method of the array substrate claimed as claim 1, further comprising:
   before the first insulating layer is formed, forming a gate line on the base substrate;
   in the first insulating layer, when the first through hole and the second through hole are formed, also forming a third through hole exposing the gate line and a second recess between the first through hole and the second through hole; and
   after the grinding process is conducted, retaining the conductive layer in the second recess and the third through hole to form a gate electrode, which is electrically connected to the gate line via the third through hole.

7. The manufacturing method of the array substrate claimed as claim 1, further comprising:
   forming a gate line and a gate electrode electrically connected to the gate line on the base substrate; and
   forming a second insulating layer that covers the gate line and the gate electrode, wherein the active layer is formed on the second insulating layer.

8. The manufacturing method of the array substrate claimed as claim 6, further comprising:
   forming the common electrode simultaneous with formation of the gate line.

9. The manufacturing method of the array substrate claimed as claim 1, wherein the grinding process is a chemical mechanical polishing process, and after the grinding process is conducted on the first insulating layer with the conductive layer deposited thereon, a flat surface is obtained.

10. A manufacturing method of an array substrate, comprising:
    providing a base substrate;
    sequentially forming an active layer and a first insulating layer that covers the active layer on the base substrate;
    performing one patterning process on the first insulating layer, so as to form a first through hole and a second through hole that expose the active layer in the first insulating layer, and form a first recess at a surface of the first insulating layer;
    forming a conductive layer on the patterned first insulating layer, with the conductive layer being filled in the first through hole, the second through hole, and first recess; and
    conducting a grinding process to remove the conductive layer on the surface of the first insulting layer and retain the conductive layer in the first through hole, the second through hole, and the first recess, whereby a source electrode, a drain electrode, and a pixel electrode are formed, respectively;
    wherein the one pattering process comprises:
    coating a photoresist on the first insulating layer;
    conducting exposure on the photoresist with graytone mask or a halftone mask, then performing development of exposed photoresist so as to form a photoresist mask layer including a photoresist fully-retained region, a photoresist half-retained region, and a photoresist fully-removed region;

forming a first blinding hole and a second blind hole with a first etching process;

removing the photoresist in the photoresist half-retained region with an ashing process;

forming the first recess as well as the first through hole and the second through hole that expose the active layer at locations of the first blind hole and the second blind hole with a second etching process, the first through hole being a stepped hole including a first portion and a second portion, the second through hole being a stepped hole including a third portion and a fourth portion; and removing the photoresist.

11. An array substrate, comprising:

a base substrate;

an active layer on the base substrate and a first insulating layer covering the active layer, the first insulating layer having a first through hole and a second through hole that expose the active layer, and a first recess at a surface of the first insulating layer;

a source electrode and a drain electrode that are located in the first through hole and the second through hole in the first insulating layer, respectively, and connected to the active layer, and a pixel electrode in the first recess;

a third recess at the surface of the first insulating layer; and a common electrode in the third recess.

12. The array substrate claimed as claim 11, wherein the active layer is a graphene-like semiconductor layer formed by controlling substitution of part of carbon atoms in a graphene conductor layer with atoms of a substitution element, and the substitution element is at least one of various elements including a fifth main group element, a sixth main group element, a seventh main group element and a lanthanide element.

13. The array substrate claimed as claim 11, further comprising:

a gate line covered by the first insulating layer;

a third through hole that is in the first insulating layer and exposes the gate line and a second recess at the surface of the first insulating layer; and a gate electrode in the second recess and the third through hole, wherein the gate electrode is electrically connected to the third through hole and the gate line.

14. The array substrate claimed as claim 11, further comprising:

a gate line on the base substrate and a gate electrode electrically connected to the gate line; and a second insulating layer covering the gate line and the gate electrode, wherein the active layer is on the second insulating layer.

15. A display apparatus, comprising the array substrate claimed as claim 11.

* * * * *